United States Patent [19]

Armitage, Jr. et al.

[11] 4,165,558

[45] Aug. 28, 1979

[54] FABRICATION OF PHOTOVOLTAIC DEVICES BY SOLID PHASE EPITAXY

[76] Inventors: William F. Armitage, Jr., 5 Baron Park La., Apt. 37, Burlington, Mass. 01803; Everett E. Crisman, 8 East St., Providence, R.I. 02906

[21] Appl. No.: 853,325

[22] Filed: Nov. 21, 1977

[51] Int. Cl.² ............... H01L 21/20; H01L 21/24
[52] U.S. Cl. .......................... 29/572; 29/591; 29/590; 148/176; 357/30; 357/67; 357/68
[58] Field of Search .............. 357/30, 16; 29/572, 29/591; 148/176, 177, 1.5

[56] References Cited

U.S. PATENT DOCUMENTS

| | | | |
|---|---|---|---|
| 2,789,068 | 4/1957 | Maserjian | 357/30 |
| 2,861,229 | 11/1958 | Pankove | 357/30 |
| 2,862,160 | 11/1958 | Ross | 357/30 |
| 3,413,157 | 11/1968 | Kuiper | 148/1.5 |
| 4,003,770 | 1/1977 | Janowiecki et al. | 357/30 |
| 4,058,418 | 11/1977 | Lindmayer | 357/30 |
| 4,062,038 | 12/1977 | Cuomo et al. | 357/30 |
| 4,070,206 | 1/1978 | Kressel et al. | 357/30 |

OTHER PUBLICATIONS

Canali et al., "Solid-Phase Epitaxial Growth of Si...," J. Applied Physics, vol. 46, No. 7, Jul. 1975, pp. 2831-2836.
Pretorius et al., "Dissociation Mechanism for Solid-Phase Epitaxy of Silicon...," Applied Physics Letters, vol. 29, No. 9, Nov. 1, 1976, pp. 598-600.

Primary Examiner—William D. Larkins

[57] ABSTRACT

Fabrication of photovoltaic devices by solid phase epitaxy; devices produced by this method consisting of a semiconductor base and a semiconductor junction-forming epitaxial layer. The epitaxial layer grown by solid phase means from a metal-semiconductor alloy or from a sandwich structure of semiconductor/metal on the semiconductor base.

7 Claims, 6 Drawing Figures

FABRICATION OF PHOTOVOLTAIC DEVICES BY SOLID PHASE EPITAXY

BACKGROUND AND OBJECT OF THE INVENTION

At the present time, most photovoltaic energy conversion devices, or solar cells, as they are also known, are constructed from the semiconducting material silicon. Such constructions are accomplished by the high temperature diffusion of suitable impurity atoms into a single crystal silicon base to produce a p-n junction near the surface of the base and in a plane parallel to said surface. Light incident on said diffused surface produces the photovoltaic effect—the direct conversion of light into electricity. Typically such diffusions are carried out at temperatures on the order of 1100° C. The depth of the diffusion and the concentration of the diffused impurity atoms are determined by trade-offs between the sheet resistance of the diffused layer and the optical absorption of the base material. Values of the junction depth and impurity atom profile will vary depending upon the particular material utilized for the base.

The primary problem that exists in using solar cells produced by this method for large-scale earth-based power systems has been the high cost of the cells. This high cost can be attributed to three factors: (1) the current low production rate of solar cells, (2) the complex processes involved in the production of the devices, and (3) the high cost of the single crystal semiconductor wafers used as the starting material for cell fabrication. At present, these factors combine to make the cost of solar cells approximately thirty times the cost which is generally considered to be necessary to make photovoltaic power supplies competitive with nuclear power.

It is therefore a primary object of the present invention to reduce the cost of photovoltaic devices by a simplification of the fabrication process, which will also permit the utilization of a lower cost starting material, such as polycrystalline material.

Other objects, features and advantages of the invention will become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figure 1:
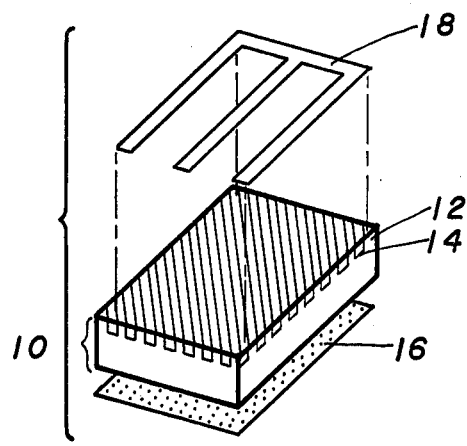
FIG. 1 is an exploded perspective view showing a conventional simple crystal solar cell.

Since silicon is the most common semiconductor material used in commercial solar cell production, we utilize silicon as the base material in our description of the current invention. However, it will be understood that the present invention is applicable to semiconductors other than silicon, such as germanium and gallium arsenide, among others. The applicability of the present invention to other semiconductor materials will be apparent to those skilled in the art. As discussed previously, commercially-available silicon solar cells are fabricated from high cost single crystal materials, through processes which are complex, energy intensive, and expensive. The present invention reduces the complexity and cost of solar cell production by utilizing an epitaxial growth and simultaneous doping process which permits fabrication of p-n junctions at temperatures significantly below those used in the standard diffusion process. The use of lower temperatures in the p-n junction formation permits the present invention to be also applied to polycrystalline base materials, offering further cost reductions.

There follows a description of the physical phenomenon which is exploited in the fabrication of solar cells according to the present invention. The aluminum-silicon (Al-Si) system is considered in this description. The use of the Al-Si system in the description is not intended to imply that this is the only materials system which exhibits this phenomenon; rather, it is merely intended to be illustrative of the type of materials systems which demonstrate this behavior. A wide variety of metal-semiconductor combinations exhibit this behavior, including, but not limited to, Al-Si, Al-Ge, Sb-doped Au-Si, Sb-doped Au-Ge, and Sn-GaAs. The phenomenon requires semiconductors which have a sufficiently high diffusivity in the metal and a metal which has a sufficient solid solubility in the semiconductor. The choice of metal-semiconductor combinations should be readily predictable by anyone versed in semiconductor/materials science.

When a system consisting of aluminum in contact with silicon is heated to a temperature in the range from approximately 300° C. to 576° C., i.e., at an elevated temperature but one where only the solid phases of the materials are present, a high rate of diffusion of silicon into aluminum occurs. At such temperatures, silicon diffusion into aluminum occurs by a vacancy mechanism along the grain boundaries of the aluminum at a much higher rate than either the bulk diffusion of silicon into aluminum or the diffusion of aluminum into silicon. The diffusion of silicon into aluminum is a function of time and temperature up to the solid-solubility limit of silicon in aluminum, which is approximately 1.6 atomic percent at the eutectic temperature of 576° C.

This solid phase transport phenomenon can be exploited to produce semiconductor layers at low temperatures. If the solid solubility requirements of the semiconductor in the metal, e.g., silicon (Si) in aluminum (Al), are exceeded by employing a super-saturated combination of semiconductor-in-metal prior to the heat treatment, the excess semiconductor can be caused to segregate out of metal upon heating. Normally, the segregation will take the form of "islands" of semiconductor material distributed through the metal. When the super-saturated metal-semiconductor combination is in contact with an underlying substrate material, careful control of the temperatures gradient across the interface between said saturated metal and said semiconductor can cause substantially all of the diffusing semiconductor to migrate to the interface between the metal-semiconductor combination and the substrate, where the diffusing semiconductor can be caused to grow as a continuous epitaxial semiconductor layer on the substrate. Returning to the Al-Si system, the deposition of a layer of Al supersaturated with Si on a Si-substrate, and the application of an appropriate heat treatment can cause the excess Si to migrate to the Al/Si-substrate interface and to form a continuous epitaxial layer of Si on the Si base; said layer containing Al at the solid solubility of Al in silicon (~1.6%).

Referring now to the drawings, FIG. 1 shows a conventional single crystal solar cell comprising a single crystal base wafer 10, silicon in this example, the top surface of same, or the surface to which illumination is to be applied, having diffused therein a suitable impurity layer 12 to produce a p-n junction 14 near the surface to be illuminated and in a plane parallel to said surface. A bottom surface 16 of electrically conductive metallic material is deposited on the underside of wafer 10, i.e., the surface where no illumination is to be applied, and functions as one of the ohmic contacts for the cell. The other ohmic contact 18, also a thin metal deposition, is applied to the top surface of the wafer 10 in the form of a finger or grid array.

Figure 2:
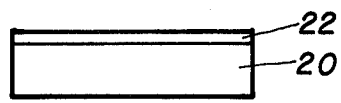
FIGS. 2 and 3 are section views showing steps in the fabrication of a solar constructed in accordance with the present invention.
Figure 3:
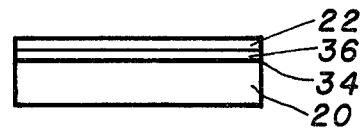

Referring now to FIGS. 2 and 3 there is shown the construction of a solar cell fabricated in accordance with the present invention. A layer of aluminum-silicon (Al-Si) alloy 22 is deposited on the surface of a silicon base wafer 20 of either single crystal or polycrystalline material. The application of a suitable heat treatment causes a solid-phase migration of the silicon to the interface 34 of the alloy layer 22 and the base wafer 20, effecting the epitaxial growth of a silicon layer 36 at the interface 34. The migrating silicon carries with it aluminum up to the solid solubility limit of aluminum in silicon, causing the epitaxially grown silicon layer to be p-type. If the base wafer 20 in n-type, a p-n junction is formed at the interface 34.

Figure 4:
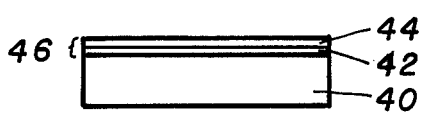
FIGS. 4 and 5 are section views showing steps in the fabrication of a modified form of solar cell construction that may be utilized in accordance with the present invention.
Figure 5:
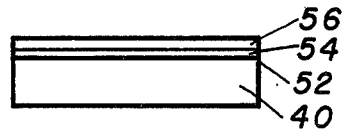

FIGS. 4 and 5 show an alternate manifestation of the present invention. The doped epitaxial layer produced by solid phase migration and epitaxial crystal growth can be fabricated by the deposition of a layered structure 46 on the base wafer 40. This layered structure 46 consists of a metal layer 42 in contact with the base wafer 40 and a semiconductor layer 44, deposited on the metal layer 42. Following the example of the aluminum-silicon system, the base wafer 40 is n-type silicon, the metal layer 42 is aluminum, and the semi-conductor layer 44 is silicon. The application of a suitable heat treatment causes the silicon layer 44 to migrate through the aluminum 42 and to grow as a p-type epitaxial layer 54 at the surface 52 of the base wafer 40. A p-n junction is formed at the interface 52 of the base wafer 40 and the solid phase epitaxially grown layer 54. The transport of the surface silicon layer 44 through the aluminum layer 42 causes the aluminum to remain as a surface layer 56 following the transport and growth of the aluminum-doped silicon epitaxial layer 54.

Figure 6:
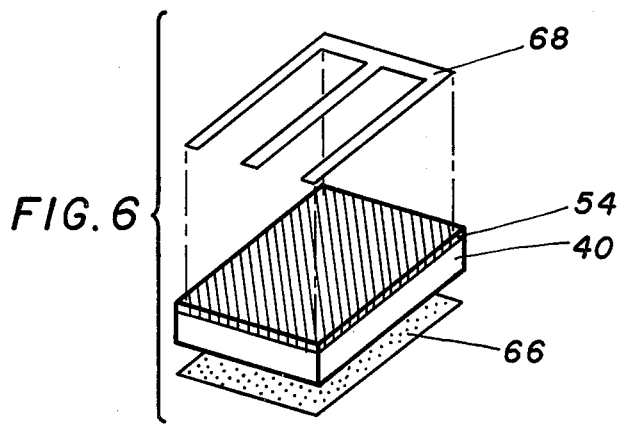
FIG. 6 is an exploded perspective view showing a solar cell constructed in accordance with the present invention.

After the solid phase growth of the epitaxial layer, the residual surface aluminum can be stripped away and ohmic contact fingers 68 can be applied by utilizing techniques which are well known in the industry. Alternatively, the aluminum could be selectively removed, with the remaining material serving as an ohmic contact to the grown p-type silicon layer 54. In addition, an ohmic contact 66 must be applied to the back of the base wafer 40, i.e., the side that is not to be illuminated. The techniques for producing ohmic contacts on semiconductors are well known in the art and form no part of the present invention. The preceding discussion refers to FIG. 6.

While there is shown and described herein certain specific structure embodying the invention, it will be manifest to those skilled in the art that various modifications and rearrangements of the parts may be made without departing from the spirit and scope of the underlying invention and that same is not limited to the particular forms herein shown and described except insofar as indicated by the scope of the appended claims. If the solid solubility requirements of the semiconductor in the metal, e.g., Si in Al, are exceeded by employing a super-saturated combination of semiconductor-in-metal prior to the heat treatment the excess semiconductor can be caused to diffuse out of the metal. When the super-saturated metal-semiconductor is in contact with an underlying substrate material, the diffusing semiconductor will migrate to the interface between the metal-semiconductor combination and the substate and grow as an epitaxial semiconductor layer on the substrate. Returning again to the Al-Si system, the deposition of a layer of Al super-saturated with Si on a Si base, or substrate, and the application of an appropriate heat treatment will cause the excess Si to migrate to the Al/Si-Si interface and to form an epitaxial layer of Si on the Si base.

We claim:

1. A method of forming a photovoltaic semiconductor device, comprising the steps of:
   providing a semiconductor substrate of a given conductivity type having at least one substantially flat surface;
   depositing a composite of metal and semiconductor on said flat surface, said composite containing dopant impurities capable of rendering the semiconductor of said composite opposite in conductivity type to said given conductivity type;
   heating said semiconductor substrate and composite to a temperature, less than the melting temperature of said composite, sufficient to cause said semiconductor of said composite to epitaxially grow on said semiconductor substrate as a layer of opposite conductivity type to said given conductivity type; and,
   selectively stripping away the residual of said composite to leave a grid of said residual in ohmic contact with said layer of opposite conductivity type.

2. The method of claim 1, where said composite is an alloy of the metal and semiconductor components thereof.

3. The method of claim 1, wherein said composite of metal and semiconductor is a layered structure of metal and semiconductor layers.

4. The method of claim 1, whrein said metal used in metal-semiconductor composite being aluminum, gold, indium, silver, platinum, lead, gallium, tin, or alloys containing these metals.

5. The method of claim 1, wherein said impurities being aluminum, arsenic, boron, antimony, phosphorous, gallium, indium, or tin.

6. The method of claim 1, wherein said semiconductor substrate is silicon, germanium, or gallium arsenide.

7. The method of claim 1, wherein said epitaxially grown semiconductor layer is silicon, germanium, or gallium arsenide.

* * * * *